United States Patent
Kusuda et al.

(10) Patent No.: US 8,891,948 B2
(45) Date of Patent: Nov. 18, 2014

(54) HEAT TREATMENT APPARATUS AND HEAT TREATMENT METHOD FOR HEATING SUBSTRATE BY IRRADIATING SUBSTRATE WITH FLASHES OF LIGHT

(75) Inventors: Tatsufumi Kusuda, Kyoto (JP); Kazuyuki Hashimoto, Kyoto (JP)

(73) Assignee: Dainippon Screen Mfg. Co., Ltd. (JP)

(*) Notice: Subject to any disclaimer, the term of this patent is extended or adjusted under 35 U.S.C. 154(b) by 367 days.

(21) Appl. No.: 13/109,169

(22) Filed: May 17, 2011

(65) Prior Publication Data

US 2012/0076476 A1  Mar. 29, 2012

(30) Foreign Application Priority Data

Sep. 27, 2010 (JP) ................. 2010-215647

(51) Int. Cl.
| | |
|---|---|
| G01J 5/10 | (2006.01) |
| G01J 5/20 | (2006.01) |
| G01J 5/28 | (2006.01) |
| F27B 5/18 | (2006.01) |
| F27D 19/00 | (2006.01) |
| H01L 21/67 | (2006.01) |
| H01L 21/687 | (2006.01) |
| F27B 17/00 | (2006.01) |
| F27D 11/12 | (2006.01) |

(52) U.S. Cl.
CPC ...... *F27B 17/0025* (2013.01); *H01L 21/67248* (2013.01); *H01L 21/68792* (2013.01); *H01L 21/67115* (2013.01); *H01L 21/6719* (2013.01); *F27D 11/12* (2013.01)
USPC ........... 392/416; 219/411; 219/413; 219/502; 374/121; 374/128

(58) Field of Classification Search
None
See application file for complete search history.

(56) References Cited

U.S. PATENT DOCUMENTS

| | | | | |
|---|---|---|---|---|
| 5,561,612 | A | * | 10/1996 | Thakur ...................... 700/300 |
| 6,885,815 | B2 | * | 4/2005 | Kusuda et al. .............. 392/416 |
| 7,115,837 | B2 | * | 10/2006 | Timans et al. ............... 219/405 |

(Continued)

FOREIGN PATENT DOCUMENTS

| | | |
|---|---|---|
| JP | 2000-293562 | 10/2000 |
| JP | 2004-296625 | 10/2004 |

(Continued)

OTHER PUBLICATIONS

Japanese Office Action mailed Mar. 11, 2014 in connection with corresponding.

(Continued)

*Primary Examiner* — Joseph M Pelham
(74) *Attorney, Agent, or Firm* — Ostrolenk Faber LLP

(57) ABSTRACT

A photodiode excellent in responsivity receives flashes of light emitted from flash lamps in the process of heating a semiconductor wafer by irradiation with flashes of light, and the waveform of the intensity of the flashes of light versus time is acquired using voltage data obtained from an output from the photodiode. Then, a temperature calculating part performs a heat conduction simulation using the acquired data to calculate the temperature of the semiconductor wafer irradiated with the flashes of light from the flash lamps. The temperature of the semiconductor wafer is computed using data corresponding to the intensity of the flashes of light obtained from the output from the photodiode. This allows the determination of the surface temperature of the semiconductor wafer irradiated with the flashes of light, irrespective of the waveform of the emission intensity of the flash lamps.

12 Claims, 14 Drawing Sheets

(56) References Cited

U.S. PATENT DOCUMENTS

| | | | |
|---|---|---|---|
| 7,317,870 B2* | 1/2008 | Timans et al. | 392/416 |
| 7,445,382 B2* | 11/2008 | Camm et al. | 374/121 |
| 7,616,872 B2* | 11/2009 | Camm et al. | 392/416 |
| 7,758,238 B2* | 7/2010 | Govindaraju et al. | 374/123 |
| 8,005,351 B2* | 8/2011 | Camm et al. | 392/416 |
| 2004/0008980 A1* | 1/2004 | Morimoto et al. | 392/418 |
| 2005/0063448 A1 | 3/2005 | Kusuda | 374/1 |
| 2005/0063453 A1* | 3/2005 | Camm et al. | 374/161 |
| 2008/0069550 A1* | 3/2008 | Timans et al. | 392/411 |
| 2008/0273867 A1* | 11/2008 | Camm et al. | 392/416 |
| 2009/0067823 A1 | 3/2009 | Kusuda | 392/418 |
| 2009/0103906 A1 | 4/2009 | Kusuda | 392/418 |
| 2009/0323759 A1* | 12/2009 | Govindaraju et al. | 374/123 |
| 2011/0274417 A1* | 11/2011 | Camm et al. | 392/411 |
| 2012/0008926 A1 | 1/2012 | Kusuda | |
| 2012/0012983 A1 | 1/2012 | Ono et al. | |
| 2012/0288261 A1* | 11/2012 | Hashimoto et al. | 392/416 |
| 2013/0224967 A1 | 8/2013 | Kusuda | |

FOREIGN PATENT DOCUMENTS

| | | | |
|---|---|---|---|
| JP | 2005227275 A * | 8/2005 | |
| JP | 2006-135126 | 5/2006 | |
| JP | 2009-070948 | 4/2009 | |
| JP | 2010-100495 | 5/2010 | |
| JP | 2010-114293 | 5/2010 | |
| JP | 2010-219462 | 9/2010 | |
| JP | 2010-228929 | 10/2014 | |

OTHER PUBLICATIONS

Japanese Patent Application No. 2010-215647 and English translation thereof.

Japanese Office Action dated Jun. 3, 2014 in corresponding Japanese. Patent Application No. JP2010-215647 (with partial English language translation).

* cited by examiner

FIG. 1
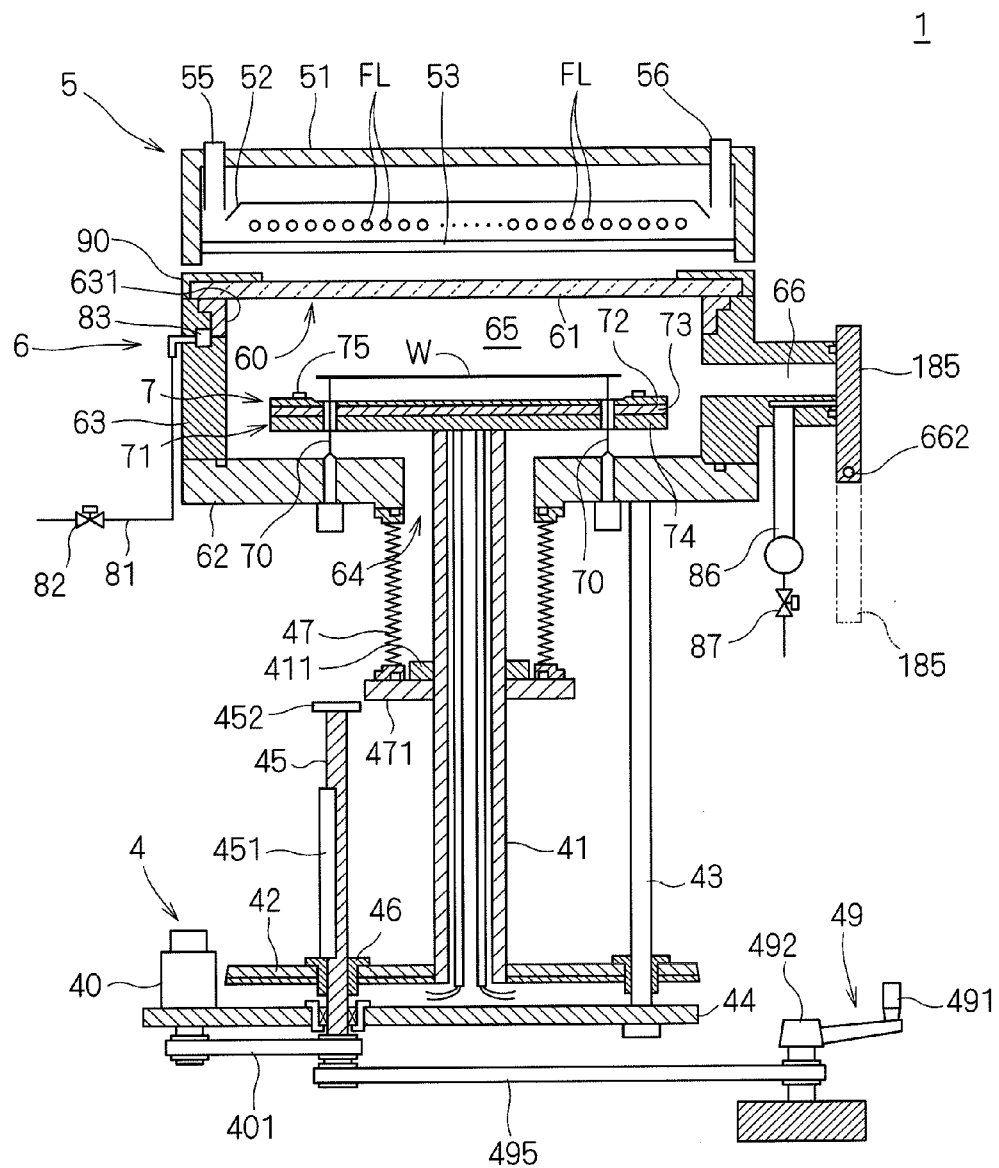
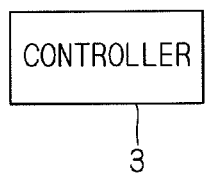

F I G. 2
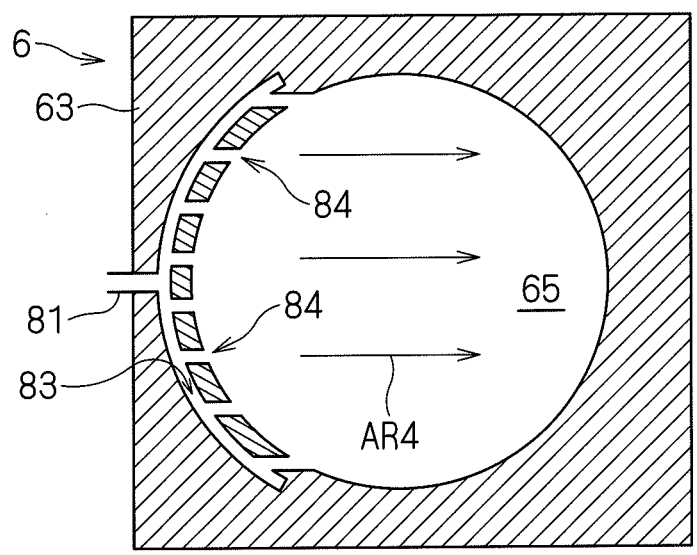

F I G . 4
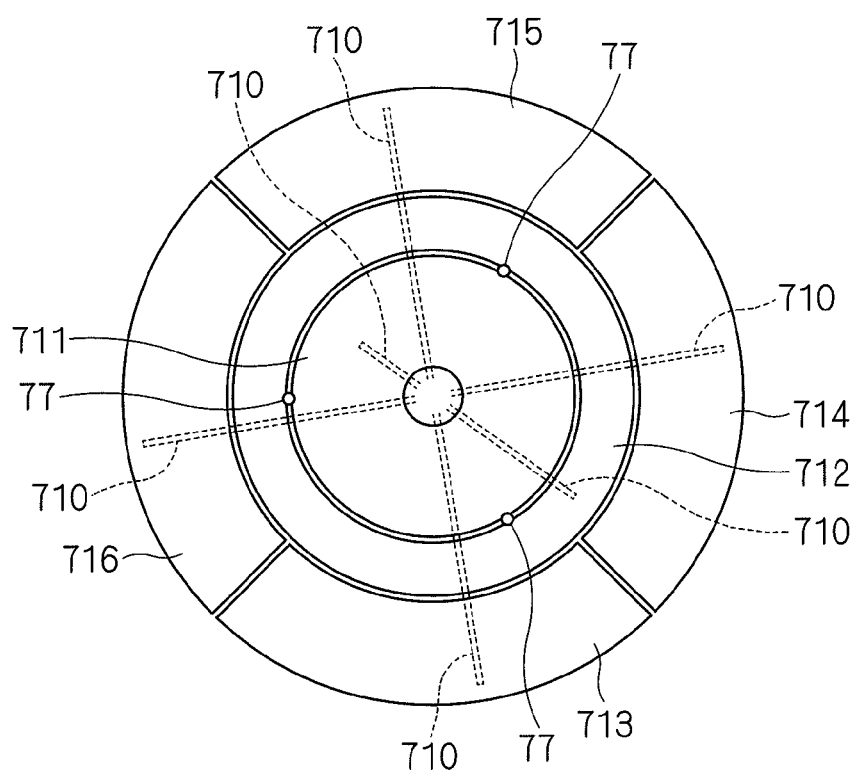

FIG. 5
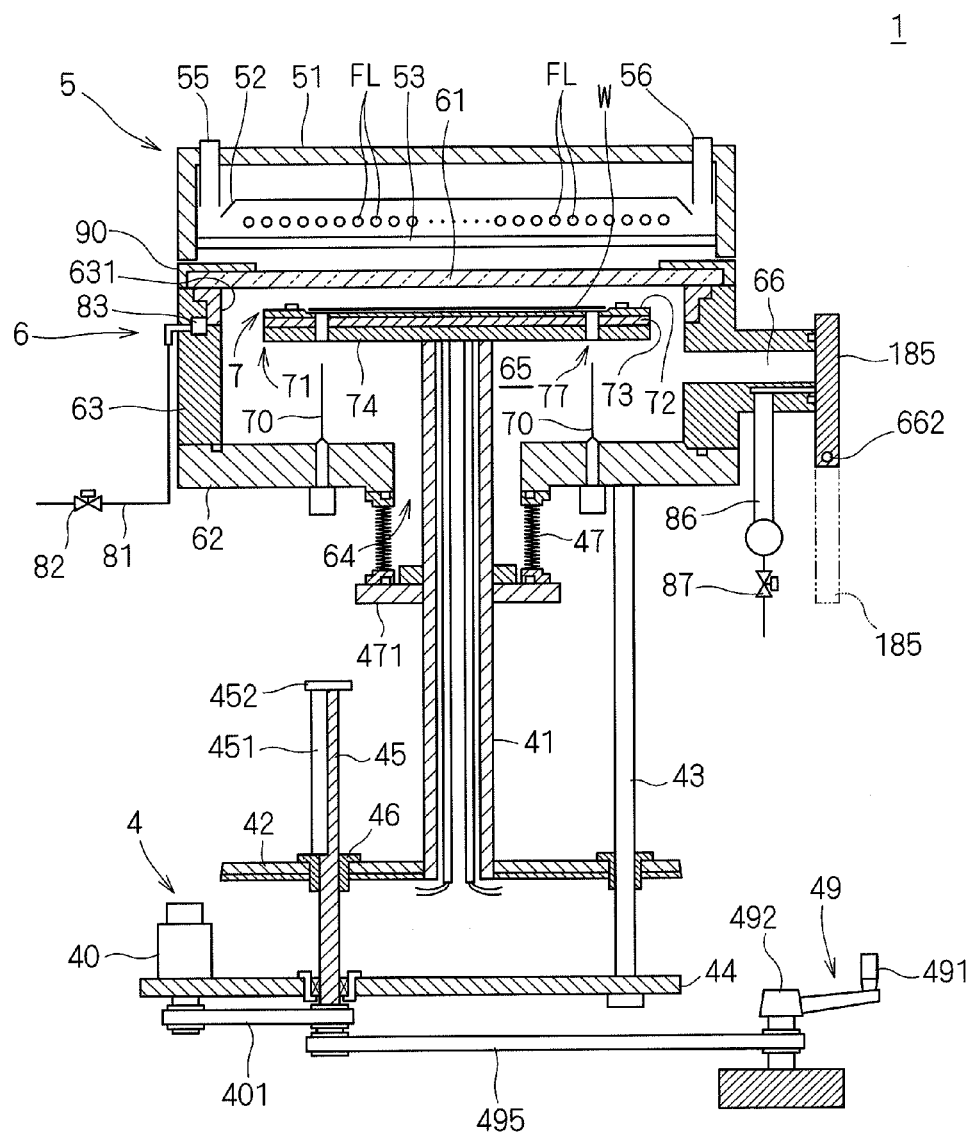
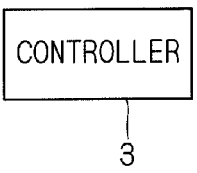

F I G . 1 0
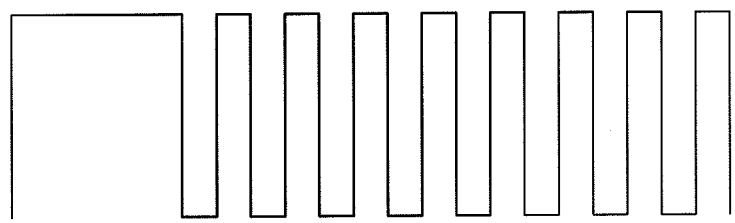
F I G . 1 1
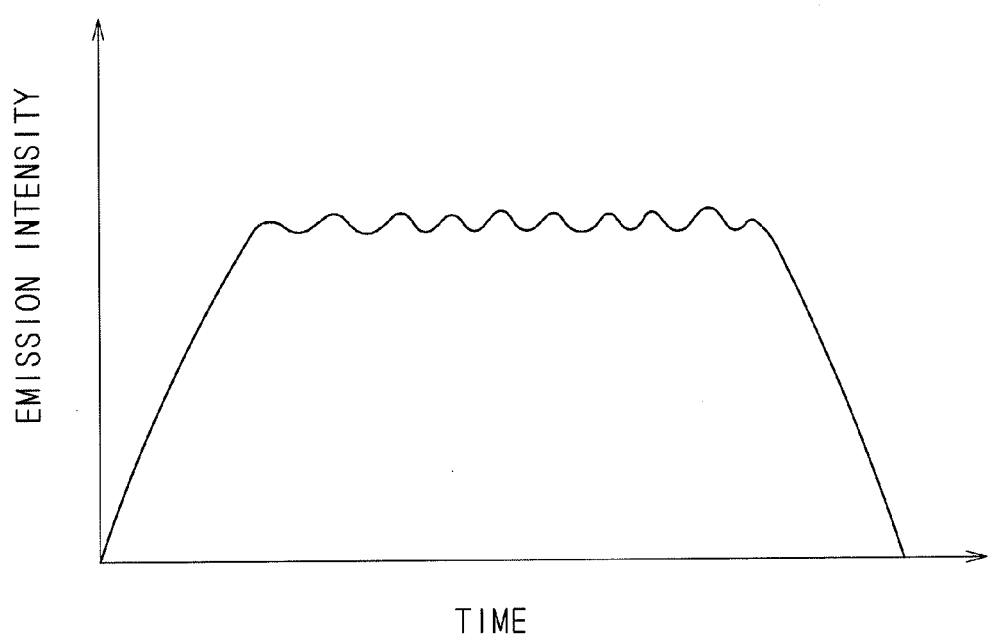

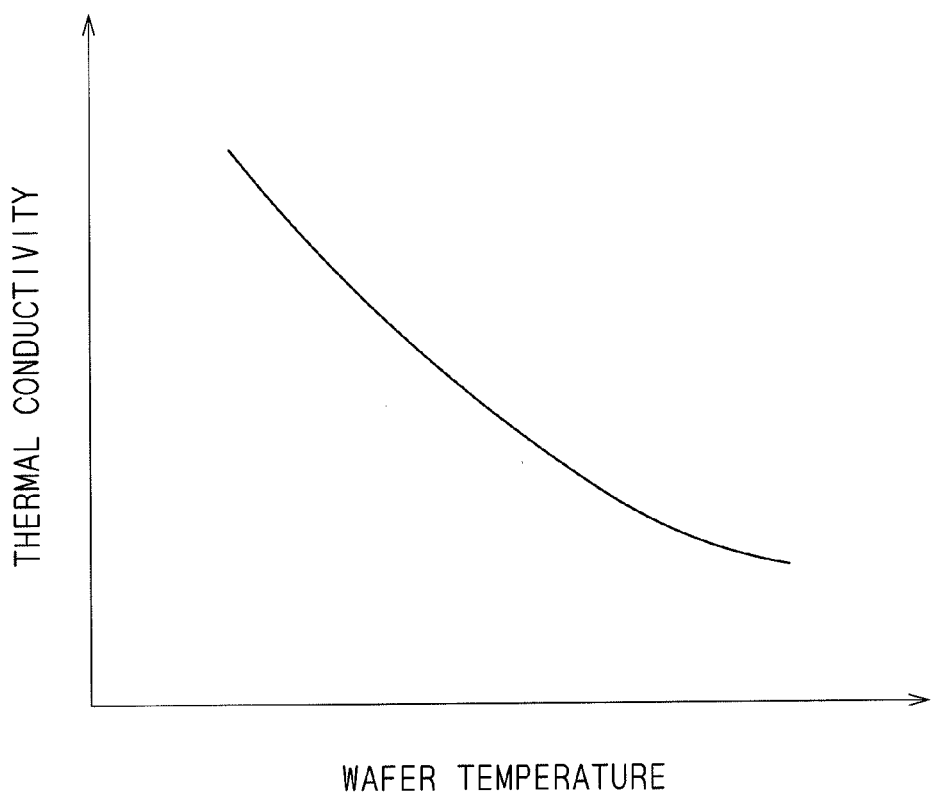
F I G . 1 4

F I G . 1 5
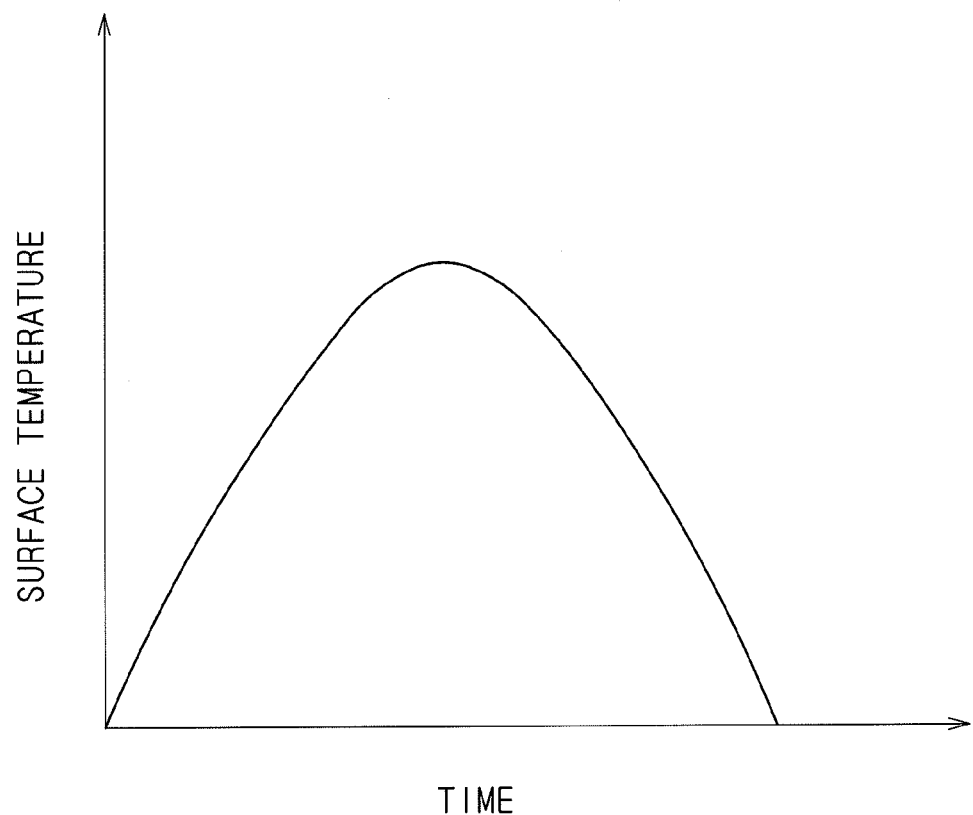

HEAT TREATMENT APPARATUS AND HEAT TREATMENT METHOD FOR HEATING SUBSTRATE BY IRRADIATING SUBSTRATE WITH FLASHES OF LIGHT

BACKGROUND OF THE INVENTION

1. Field of the Invention

The present invention relates to a heat treatment apparatus and a heat treatment method for heating a thin plate-like precision electronic substrate such as a semiconductor wafer and a glass substrate for a liquid crystal display device (hereinafter referred to simply as a "substrate") by irradiating the substrate with flashes of light.

2. Description of the Background Art

In the process of manufacturing a semiconductor device, impurity doping is an essential step for forming a pn junction in a semiconductor wafer. At present, it is common practice to perform impurity doping by an ion implantation process and a subsequent annealing process. The ion implantation process is a technique for causing ions of impurity elements such as boron (B), arsenic (As) and phosphorus (P) to collide against the semiconductor wafer with high acceleration voltage, thereby physically implanting the impurities into the semiconductor wafer. The implanted impurities are activated by the subsequent annealing process. When annealing time in this annealing process is approximately several seconds or longer, the implanted impurities are deeply diffused by heat. This results in a junction depth much greater than a required depth, which might present a problem in good device formation.

In recent years, attention has been given to flash lamp annealing (FLA) that is an annealing technique for heating a semiconductor wafer in an extremely short time. The flash lamp annealing is a heat treatment technique in which xenon flash lamps (the term "flash lamp" as used hereinafter refers to a "xenon flash lamp") are used to irradiate the surface of a semiconductor wafer with flashes of light, thereby raising the temperature of only the surface of the semiconductor wafer doped with impurities in an extremely short time (several milliseconds or less).

The xenon flash lamps have a spectral distribution of radiation ranging from ultraviolet to near-infrared regions. The wavelength of light emitted from the xenon flash lamps is shorter than that of light emitted from conventional halogen lamps, and approximately coincides with a fundamental absorption band of a silicon semiconductor wafer. Thus, when a semiconductor wafer is irradiated with flashes of light emitted from the xenon flash lamps, the temperature of the semiconductor wafer can be raised rapidly, with only a small amount of light transmitted through the semiconductor wafer. Also, it has turned out that the irradiation of a semiconductor wafer with flashes of light in an extremely short time of several milliseconds or less allows a selective temperature rise only near the surface of the semiconductor wafer. Therefore, the temperature rise in an extremely short time with the xenon flash lamps allows only the activation of impurities to be achieved without deep diffusion of the impurities.

U.S. Patent Application Publication No. US-2005-0063448-A1 discloses a technique in which a light measuring part in a flash lamp annealer includes a calorimeter disposed outside a chamber body, a light guide structure for guiding light emitted inside the chamber body to the calorimeter, and a calculating part for performing computations on the basis of an output from the calorimeter, the light measuring part being adapted to measure the energy of light emitted from flash lamps inside the chamber body by means of the calorimeter.

U.S. Patent Application Publication No. US-2005-0063448-A1 also discloses a technique in which the surface temperature of a substrate is obtained by computations, based on the energy of flashes of light measured by means of the calorimeter.

U.S. Patent Application Publications Nos. US-2009-0067823-A1 and US-2009-0103906-A1 present techniques in which an IGBT (insulated gate bipolar transistor) is used to provide chopper control over the current flowing through a flash lamp, thereby causing the flash lamp to emit light for a period of time (approximately 10 milliseconds or more) longer than that for which the flash lamp simply emits light. The use of such techniques allows the surface temperature of a semiconductor wafer to increase or decrease slightly slowly, thereby achieving the better activation of impurities and the recovery of defects created in a layer deeper than an impurity-doped layer during ion implantation. However, the temperature can be said to increase or decrease slowly, as compared with the ultrahigh-speed increase or decrease in temperature caused by simple light emission from the flash lamp, and this increase or decrease in temperature occurs in a very short time as compared with that caused by conventional halogen lamp annealing and the like.

The technique disclosed in U.S. Patent Application Publication No. US-2005-0063448-A1 is to measure the total energy (the total amount of heat) of a single flash of light. The light emission from a flash lamp is caused by discharging electrical charges stored in a capacitor with a predetermined voltage between lamp electrodes. Thus, the total energy of a single flash of light is determined generally by the capacitance of the capacitor and the charging voltage on the condition that all of the electrical charges stored in the capacitor are discharged.

However, in the techniques in which the IGBT is used to provide chopper control over the current flowing through a flash lamp as disclosed in U.S. Patent Application Publications Nos. US-2009-0067823-A1 and US-2009-0103906-A1, the waveform pattern of the emission intensity of the flash lamp is freely adjustable. For example, these techniques are capable of causing the flash lamp to emit high-intensity light for a short period of time (several milliseconds) or to emit relatively low-intensity light for a long period of time (tens of milliseconds). Different intensity waveforms of flashes of light with the same total energy of the flashes of light provide different surface temperature profiles of semiconductor wafers, resulting in different maximum temperatures achieved. For heat treatment using irradiation with light as disclosed in U.S. Patent Application Publications Nos. US-2009-0067823-A1 and US-2009-0103906-A1, it is therefore impossible to determine the surface temperature of a semiconductor wafer from the energy of flashes of light using the technique disclosed in U.S. Patent Application Publication No. US-2005-0063448-A1.

If the chopper control using the IGBT is not provided, there have been cases where different intensity waveforms of light emitted from flash lamps with the same total energy occur due to variations between the flash lamps (e.g., individual differences in distance between electrodes and in sealed-in gas pressure) and the deterioration of the flash lamps themselves. In such cases, a semiconductor wafer has fluctuating maximum temperatures achieved, which in turn makes it impossible to precisely calculate the temperature from the energy of the flashes of light.

SUMMARY OF THE INVENTION

The present invention is intended for a heat treatment apparatus for heating a substrate by irradiating the substrate with flashes of light.

According to one aspect of the present invention, the heat treatment apparatus comprises: a chamber for receiving a substrate; a holder for holding the substrate within the chamber; a flash lamp received in a lamp house and configured to irradiate the substrate held by the holder with flashes of light; a photodiode for receiving the flashes of light directed from the flash lamp; and a temperature calculating part for calculating the temperature of the substrate irradiated with the flashes of light directed from the flash lamp, based on an output from the photodiode.

The temperature of the substrate irradiated with the flashes of light is calculated, based on the output from the photodiode for receiving the flashes of light emitted from the flash lamp. The temperature of the substrate is calculated using the data corresponding to the intensity of the flashes of light obtained from the output from the photodiode. This allows the determination of the surface temperature of the substrate irradiated with the flashes of light, irrespective of the waveform of the emission intensity.

Preferably, the temperature calculating part calculates the temperature of each of the regions at the second time, using a thermal conductivity at the temperature of each of the regions at the first time.

This allows the surface temperature of the substrate to be determined more precisely.

The present invention is also intended for a method of heating a substrate by irradiating the substrate with flashes of light.

According to one aspect of the present invention, the method comprises the steps of: (a) directing flashes of light from a flash lamp onto a substrate; and (b) receiving the flashes of light directed from the flash lamp, using a photodiode, to calculate the temperature of the substrate irradiated with the flashes of light directed from the flash lamp, based on an output from the photodiode.

The photodiode receives the flashes of light directed from the flash lamp, and the temperature of the substrate irradiated with the flashes of light is calculated, based on the output from the photodiode. The temperature of the substrate is calculated using the data corresponding to the intensity of the flashes of light obtained from the output from the photodiode. This allows the determination of the surface temperature of the substrate irradiated with the flashes of light, irrespective of the waveform of the emission intensity.

Preferably, the temperature of each of the regions at the second time is calculated in the step (b), using a thermal conductivity at the temperature of each of the regions at the first time.

This allows the surface temperature of the substrate to be determined more precisely.

It is therefore an object of the present invention to determine the surface temperature of a substrate irradiated with flashes of light, irrespective of the waveform of an emission intensity.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a longitudinal sectional view showing a configuration of a heat treatment apparatus according to the present invention;

FIG. 2 is a sectional view showing a gas passage in the heat treatment apparatus of FIG. 1;

FIG. 4 is a plan view of a hot plate;

FIG. 5 is a longitudinal sectional view showing the configuration of the heat treatment apparatus of FIG. 1;

FIG. 10 illustrates an example of the waveform of a pulse signal;

FIG. 11 illustrates an example of the waveform of the emission intensity of the flash lamps;

FIG. 14 is a graph showing the temperature dependence of the thermal conductivity of a semiconductor wafer; and FIG. 15 is a graph showing an example of a profile of the surface temperature of the semiconductor wafer versus time.

DESCRIPTION OF THE PREFERRED EMBODIMENTS

Figure 3:
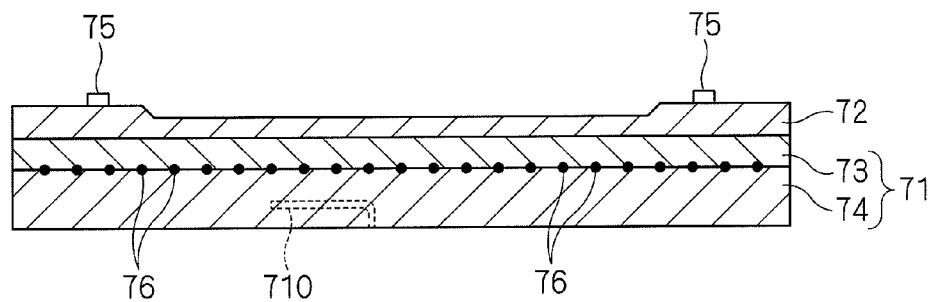
FIG. 3 is a sectional view showing a configuration of a holder.

A preferred embodiment according to the present invention will now be described in detail with reference to the drawings.

First, a general configuration of a heat treatment apparatus according to the present invention will be outlined. FIG. 1 is a longitudinal sectional view showing a configuration of a heat treatment apparatus 1 according to the present invention. The heat treatment apparatus 1 is a flash lamp annealer for irradiating a generally circular semiconductor wafer W serving as a substrate with flashes of light to heat the semiconductor wafer W.

The heat treatment apparatus 1 includes a generally cylindrical chamber 6 for receiving a semiconductor wafer W therein, and a lamp house 5 including a plurality of built-in flash lamps FL. The heat treatment apparatus 1 further includes a controller 3 for controlling operating mechanisms provided in the chamber 6 and in the lamp house 5 to cause the operating mechanisms to heat-treat a semiconductor wafer W.

The chamber 6 is provided under the lamp house 5, and includes a chamber side portion 63 having a generally cylindrical inner wall and a chamber bottom portion 62 covering the bottom of the chamber side portion 63. A space surrounded by the chamber side portion 63 and the chamber bottom portion 62 is defined as a heat treatment space 65. A top opening 60 is provided over the heat treatment space 65. A chamber window 61 is mounted to block the top opening 60.

The chamber window 61 forming the ceiling of the chamber 6 is a disk-shaped member made of quartz, and serves as a quartz window that transmits light emitted from the lamp house 5 therethrough into the heat treatment space 65. The chamber bottom portion 62 and the chamber side portion 63, which form the main body of the chamber 6, are made of, for example, a metal material such as stainless steel with high strength and high heat resistance. An upper ring 631 on the inner side face of the chamber side portion 63 is made of an aluminum (Al) alloy or the like with greater durability than stainless steel against degradation due to irradiation with light.

The chamber window 61 and the chamber side portion 63 are sealed with an O-ring for the purpose of maintaining the hermeticity of the heat treatment space 65. Specifically, the O-ring is inserted between an underside peripheral portion of the chamber window 61 and the chamber side portion 63, and a clamp ring 90 is provided to abut against an upper-side peripheral portion of the chamber window 61 and to be screwed to the chamber side portion 63, thereby forcing the chamber window 61 against the O-ring.

Figure 7:
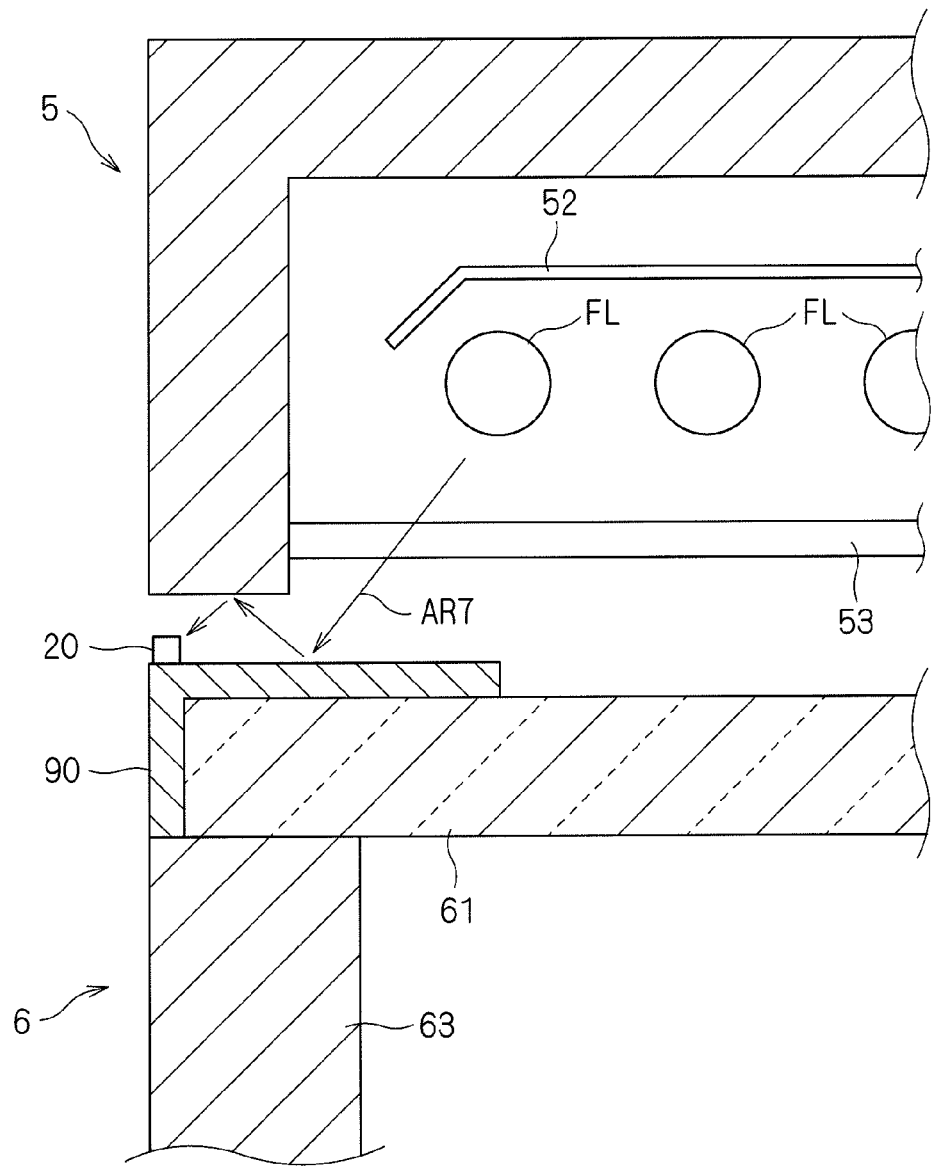
FIG. 7 is an enlarged view showing a boundary between a lamp house and a chamber.

FIG. 7 is an enlarged view showing a boundary between the lamp house 5 and the chamber 6. A gap is present between the lamp house 5 and the chamber 6. In this preferred embodiment, a light receiving part 20 is disposed in the gap between the lamp house 5 and the chamber 6. Specifically, the light receiving part 20 is provided on an upper end portion of the chamber 6 (on the upper surface of the clamp ring 90).

Figure 8:
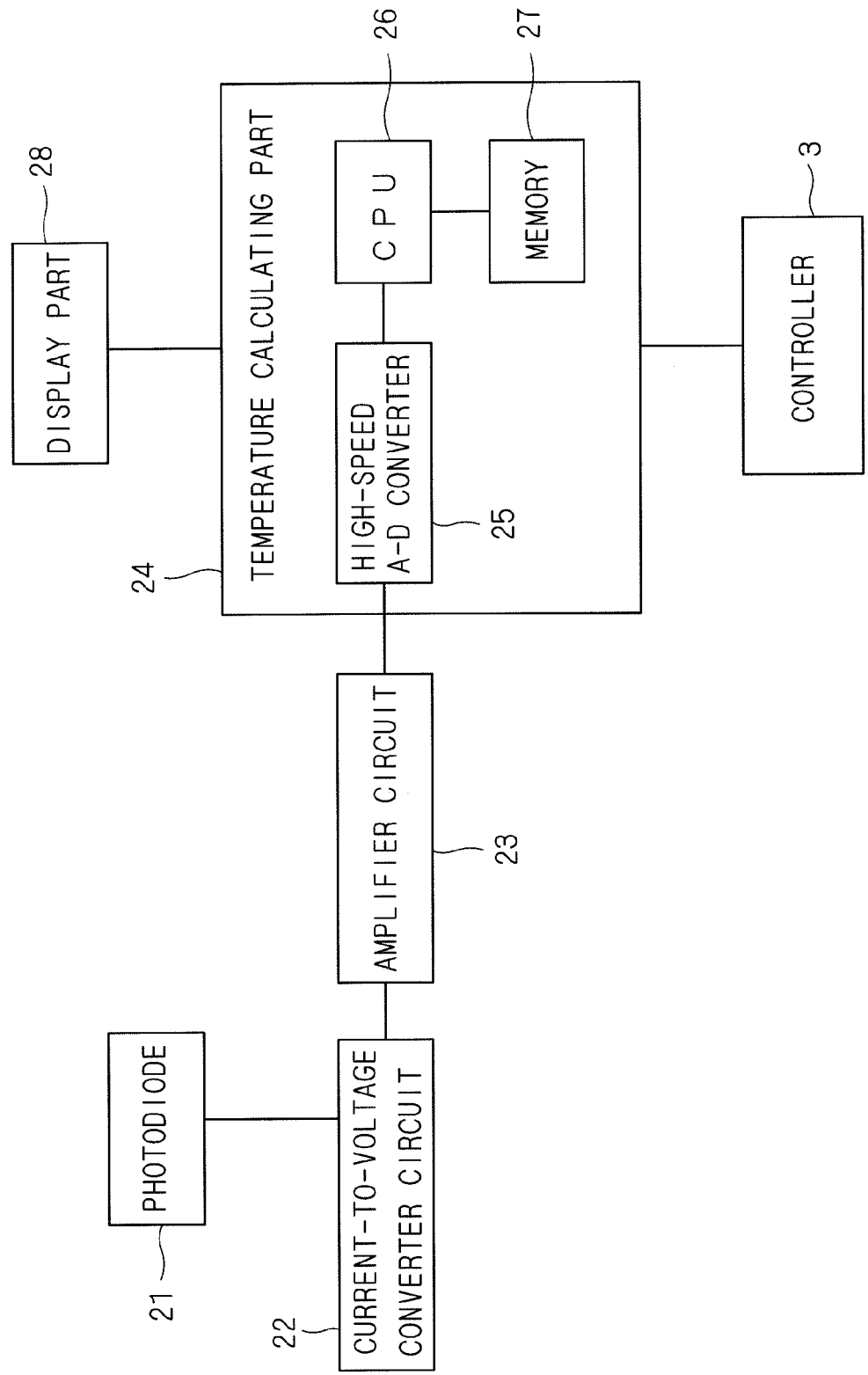
FIG. 8 is a block diagram of a peripheral structure including a temperature calculating part.

The light receiving part 20 includes a photodiode 21 (with reference to FIG. 8). The photodiode 21 used in this preferred embodiment has a measuring wavelength range overlapping the wavelength range of flashes of light emitted from the flash lamps FL (generally a visible light range). The light receiving part 20 may be provided with a filter transparent to only light in the measuring wavelength range of the photodiode 21, and an optical lens for collecting light.

As shown in FIG. 7, light from the flash lamps FL does not directly reach the position where the light receiving part 20 is provided, but light repeatedly reflected between the lamp house 5 and the chamber 6 as indicated by the arrows AR7 reaches the position. In other words, the light receiving part 20 is positioned so as to receive a leak of flashes of light emitted from the flash lamps FL and directed from the lamp house 5 toward the interior of the chamber 6.

Referring again to FIG. 1, the chamber bottom portion 62 has a plurality of (in this preferred embodiment, three) support pins 70 extending upright therefrom through a holder 7 and configured to support a semiconductor wafer W from the underside (the surface opposite the surface that receives light from the lamp house 5) of the semiconductor wafer W. The support pins 70 are made of, for example, quartz and are easy to replace because the support pins 70 are fixed from outside the chamber 6.

The chamber side portion 63 has a transport opening 66 for the transport of a semiconductor wafer W therethrough into and out of the chamber 6. The transport opening 66 is openable and closable by a gate valve 185 pivoting about an axis 662. An inlet passage 81 for introducing a processing gas (for example, an inert gas such as nitrogen ($N_2$) gas, helium (He) gas, and argon (Ar) gas; or oxygen ($O_2$) gas and the like) into the heat treatment space 65 is provided on the opposite side of the chamber side portion 63 from the transport opening 66. The inlet passage 81 has a first end connected through a valve 82 to a gas supply mechanism not shown, and a second end connected to a gas inlet buffer 83 provided inside the chamber side portion 63. The transport opening 66 is provided with an outlet passage 86 for exhausting a gas from the interior of the heat treatment space 65. The outlet passage 86 is connected through a valve 87 to an exhaust mechanism not shown.

FIG. 2 is a sectional view of the chamber 6 taken along a horizontal plane at the level of the gas inlet buffer 83. As shown in FIG. 2, the gas inlet buffer 83 is provided to extend over approximately one third of the inner periphery of the chamber side portion 63 on the opposite side from the transport opening 66 shown in FIG. 1. The processing gas introduced through the inlet passage 81 to the gas inlet buffer 83 is fed through a plurality of gas feed holes 84 into the heat treatment space 65.

The heat treatment apparatus 1 further includes the generally disk-shaped holder 7 for holding a semiconductor wafer W in a horizontal position inside the chamber 6 and preheating the held semiconductor wafer W prior to irradiation with flashes of light; and a holder elevating mechanism 4 for moving the holder 7 upwardly and downwardly relative to the chamber bottom portion 62 serving as the bottom surface of the chamber 6. The holder elevating mechanism 4 shown in FIG. 1 includes a shaft 41 of a generally cylindrical configuration, a movable plate 42, guide members 43 (in this preferred embodiment, three guide members 43 are provided around the shaft 41), a fixed plate 44, a ball screw 45, a nut 46, and a motor 40. The chamber bottom portion 62 serving as the bottom of the chamber 6 has a bottom opening 64 of a generally circular configuration having a diameter smaller than that of the holder 7. The shaft 41 made of stainless steel is inserted through the bottom opening 64 and connected to the lower surface of the holder 7 (a hot plate 71 of the holder 7 in a strict sense) to support the holder 7.

The nut 46 in threaded engagement with the ball screw 45 is fixed to the movable plate 42. The movable plate 42 is movable in a vertical direction by being slidably guided by the guide members 43 that are fixed to and extend downwardly from the chamber bottom portion 62. The movable plate 42 is coupled to the holder 7 through the shaft 41.

The motor 40 is provided on the fixed plate 44 mounted to the lower end portions of the guide members 43, and is connected to the ball screw 45 through a timing belt 401. For the holder elevating mechanism 4 to move the holder 7 upwardly and downwardly, the motor 40 serving as a driver rotates the ball screw 45 under the control of the controller 3 to move the movable plate 42 fixed to the nut 46 vertically along the guide members 43. As a result, the shaft 41 fixed to the movable plate 42 is moved vertically, so that the holder 7 connected to the shaft 41 is moved smoothly upwardly and downwardly between a transfer position shown in FIG. 1 in which a semiconductor wafer W is transferred and a treatment position shown in FIG. 5 in which the semiconductor wafer W is treated.

An upright mechanical stopper 451 of a generally semi-cylindrical shape (the shape formed by cutting a cylinder into half in a longitudinal direction) is provided on the upper surface of the movable plate 42 so as to extend along the ball screw 45. If the movable plate 42 tends to move upwardly beyond a predetermined upper limit because of any anomaly, the upper end of the mechanical stopper 451 strikes an end plate 452 provided at an end portion of the ball screw 45, so that the abnormal upward movement of the movable plate 42 is prevented. This prevents the holder 7 from being moved upwardly above a predetermined position lying under the chamber window 61, thereby avoiding a collision between the holder 7 and the chamber window 61.

The holder elevating mechanism 4 further includes a manual elevating part 49 for manually moving the holder 7 upwardly and downwardly during the maintenance of the interior of the chamber 6. The manual elevating part 49 has a handle 491 and a rotary shaft 492. Rotating the rotary shaft 492 by means of the handle 491 causes the rotation of the ball screw 45 connected through a timing belt 495 to the rotary shaft 492, thereby moving the holder 7 upwardly and downwardly.

An expandable and contractible bellows 47 surrounding the shaft 41 and extending downwardly is provided under the chamber bottom portion 62, and has an upper end connected to the lower surface of the chamber bottom portion 62. The bellows 47 has a lower end mounted to a bellows lower end plate 471. The bellows lower end plate 471 is screw-held and mounted to the shaft 41 with a collar member 411. The bellows 47 contracts when the holder elevating mechanism 4 moves the holder 7 upwardly relative to the chamber bottom portion 62, and expands when the holder elevating mechanism 4 moves the holder 7 downwardly. When the holder 7 moves upwardly and downwardly, the bellows 47 contracts and expands to maintain the heat treatment space 65 hermetically sealed.

FIG. 3 is a sectional view showing a configuration of the holder 7. The holder 7 includes the hot plate (heating plate) 71 for preheating (or assist-heating) a semiconductor wafer W, and a susceptor 72 provided on the upper surface (a surface on which the holder 7 holds a semiconductor wafer W) of the hot plate 71. The shaft 41 for moving the holder 7 upwardly and downwardly as mentioned above is connected to the lower surface of the holder 7. The susceptor 72 is made of quartz (or may be made of aluminum nitride (AlN) or the like). Pins 75 for preventing a semiconductor wafer W from shifting out of place are mounted on the upper surface of the susceptor 72. The susceptor 72 is provided on the hot plate 71, with the lower surface of the susceptor 72 in face-to-face contact with the upper surface of the hot plate 71. The susceptor 72 is thus capable of diffusing heat energy from the hot plate 71 to transfer the heat energy to the semiconductor wafer W placed on the upper surface of the susceptor 72, and is removable from the hot plate 71 for cleaning during maintenance.

The hot plate 71 includes an upper plate 73 and a lower plate 74 both made of stainless steel. Resistance heating wires 76 such as nichrome wires for heating the hot plate 71 are disposed between the upper plate 73 and the lower plate 74, and an electrically conductive brazing alloy containing nickel (Ni) fills the space between the upper plate 73 and the lower plate 74 to seal the resistance heating wires 76 therewith. The upper plate 73 and the lower plate 74 are brazed to each other at their ends.

FIG. 4 is a plan view of the hot plate 71. As shown in FIG. 4, the hot plate 71 has a disk-shaped zone 711 and an annular zone 712 arranged in concentric relation with each other and positioned in a central portion of a region opposed to the semiconductor wafer W held by the holder 7, and four zones 713 to 716 defined by circumferentially equally dividing a substantially annular region surrounding the zone 712 into four. Slight gaps are present between adjacent ones of the zones 711 to 716. The hot plate 71 is provided with three through holes 77 for receiving the respective support pins 70 therethrough and circumferentially spaced 120 degrees apart from each other along a gap between the zones 711 and 712.

In the six zones 711 to 716, the resistance heating wires 76 independent of each other are disposed so as to run around to form heaters, respectively. The heaters incorporated in the respective zones 711 to 716 individually heat the respective zones 711 to 716. A semiconductor wafer W held by the holder 7 is heated by the heaters incorporated respectively in the six zones 711 to 716. A sensor 710 for measuring the temperature of each zone with a thermocouple is provided in each of the zones 711 to 716. The sensors 710 are connected to the controller 3 through the interior of the generally cylindrical shaft 41.

For heating the hot plate 71, the controller 3 controls the amount of power supplied to the resistance heating wires 76 provided in the respective zones 711 to 716 so that the temperatures of the six zones 711 to 716 measured by the sensors 710, respectively, reach a predetermined temperature that is previously set. The temperature control in each zone by the controller 3 is PID (proportional integral derivative) control. In the hot plate 71, the temperature of each of the zones 711 to 716 is continuously measured until the heat treatment of a semiconductor wafer W is completed (or, when there are a plurality of semiconductor wafers W to be treated in succession, until the heat treatment of all of the semiconductor wafers W is completed), and the amount of power supplied to the resistance heating wires 76 installed in each zone is controlled individually, i.e., the temperature of the heater incorporated in each zone is controlled individually, so that the temperature of each zone is kept at a set temperature. The set temperature for each of the zones 711 to 716 may be changed by an individually set offset value from a reference temperature.

The resistance heating wires 76 provided in the six zones 711 to 716 are connected through power lines passing through the interior of the shaft 41 to a power supply source (not shown). On the way from the power supply source to the zones 711 to 716, the power lines extending from the power supply source are disposed inside a stainless steel tube filled with an insulator such as magnesia (magnesium oxide) or the like so as to be electrically insulated from each other. The interior of the shaft 41 is open to the atmosphere.

Next, the lamp house 5 is provided separately from the chamber 6. The lamp house 5 includes an enclosure 51, a light source including the plurality of (in this preferred embodiment, 30) xenon flash lamps FL provided inside the enclosure 51, and a reflector 52 provided inside the enclosure 51 so as to cover the light source from above. The lamp house 5 further includes a lamp light radiation window 53 mounted to the bottom of the enclosure 51. The lamp light radiating window 53 forming the floor portion of the lamp house 5 is a plate-like member made of quartz. The lamp house 5 is provided over the chamber 6, whereby the lamp light radiation window 53 is opposed to the chamber window 61. The lamp house 5 is configured to direct flashes of light from the flash lamps FL through the lamp light radiation window 53 and the chamber window 61 onto a semiconductor wafer W held by the holder 7 within the chamber 6, thereby heating the semiconductor wafer W. Also, the light receiving part 20 is provided in the gap between the lamp house 5 and the chamber 6, as mentioned above.

The flash lamps FL, each of which is a rod-shaped lamp having an elongated cylindrical shape, are arranged in a plane so that the longitudinal directions of the respective flash lamps FL are in parallel with each other along the main surface of a semiconductor wafer W held by the holder 7 (that is, in a horizontal direction). Thus, a plane defined by the arrangement of the flash lamps FL is a horizontal plane.

Figure 6:
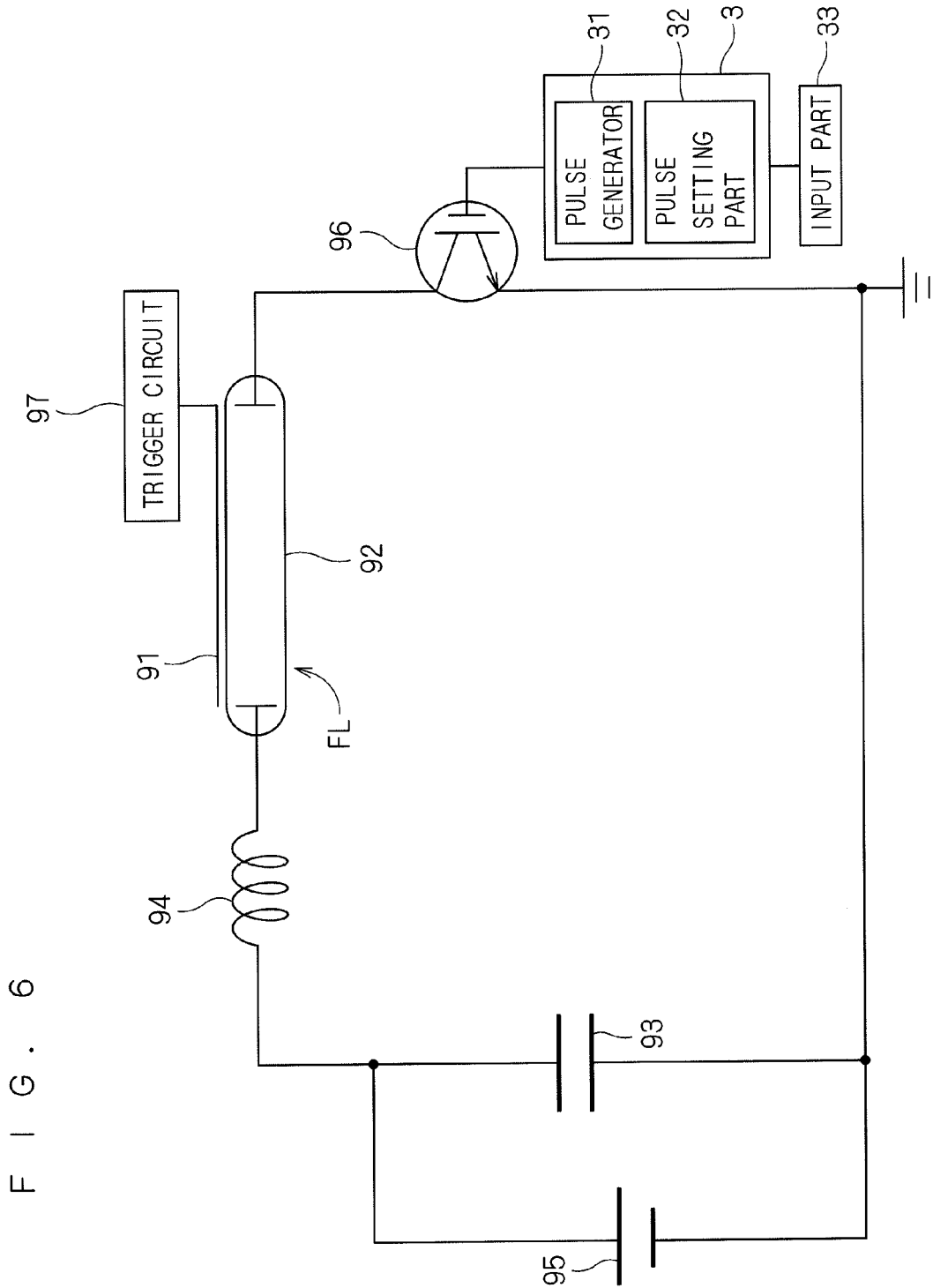
FIG. 6 is a diagram of a driving circuit for a flash lamp.

FIG. 6 is a diagram of a driving circuit for each flash lamp FL. As illustrated in FIG. 6, a capacitor 93, a coil 94, a flash lamp FL, and an IGBT (insulated-gate bipolar transistor) 96 are connected in series. Also as shown in FIG. 6, the controller 3 includes a pulse generator 31, and a pulse setting part 32, and is connected to an input part 33. Examples of the input part 33 used herein include various known input devices such as a keyboard, a mouse, and a touch panel. The pulse setting part 32 sets the waveform of a pulse signal, based on an input from the input part 33, and the pulse generator 31 generates a pulse signal in accordance with that waveform.

The flash lamp FL includes a rod-shaped glass tube (discharge tube) 92 containing xenon gas sealed therein and having positive and negative electrodes provided on opposite ends thereof, and a trigger electrode 91 attached to the outer peripheral surface of the glass tube 92. A power supply unit 95 applies a predetermined voltage to the capacitor 93, and the capacitor 93 is charged in accordance with the applied voltage. A trigger circuit 97 is capable of applying a high voltage to the trigger electrode 91. The timing of the voltage application from the trigger circuit 97 to the trigger electrode 91 is under the control of the controller 3.

The IGBT 96 is a bipolar transistor which includes a MOSFET (metal-oxide-semiconductor field-effect transistor) incorporated in the gate thereof, and is also a switching element suitable for handling a large amount of power. The pulse generator 31 in the controller 3 applies a pulse signal to the gate of the IGBT 96. When a voltage ("high" voltage) not less than a predetermined level is applied to the gate of the IGBT 96, the IGBT 96 turns ON. When a voltage ("low" voltage) less than the predetermined level is applied to the gate of the IGBT 96, the IGBT 96 turns OFF. In this manner, the driving circuit including the flash lamp FL is turned ON and OFF by the IGBT 96. By turning the IGBT 96 ON and OFF, the connection between the flash lamp FL and the capacitor 93 corresponding thereto is made and broken.

Even if, with the capacitor 93 in the charged state, the IGBT 96 turns ON to apply a high voltage across the electrodes of the glass tube 92, no electricity will flow through the glass tube 92 in a normal state because the xenon gas is electrically insulative. However, if the trigger circuit 97 applies a high voltage to the trigger electrode 91 to produce an electrical breakdown, an electrical discharge between the electrodes causes a current to flow momentarily in the glass tube 92, so that xenon atoms or molecules are excited at this time to cause light emission.

The reflector 52 shown in FIG. 1 is provided over the plurality of flash lamps FL so as to cover all of the flash lamps FL. A fundamental function of the reflector 52 is to reflect the light emitted from the plurality of flash lamps FL toward the holder 7. The reflector 52 is a plate made of an aluminum alloy. A surface of the reflector 52 (a surface which faces the flash lamps FL) is roughened by abrasive blasting to produce a stain finish thereon. Such surface roughening is required, because if the reflector 52 has a perfect mirror surface, the intensity of the reflected light from the plurality of flash lamps FL will exhibit a regular pattern, which in turn gives rise to deterioration in the uniformity of a surface temperature distribution in the semiconductor wafer W.

The controller 3 controls the aforementioned various operating mechanisms provided in the heat treatment apparatus 1. The controller 3 is similar in hardware configuration to a typical computer. Specifically, the controller 3 includes a CPU for performing various computation processes, a ROM or read-only memory for storing a basic program therein, a RAM or readable/writable memory for storing various pieces of information therein, and a magnetic disk for storing control software, data and the like therein. The controller 3 further includes the pulse generator 31, and the pulse setting part 32, and is connected to the input part 33. As mentioned above, the pulse setting part 32 sets the waveform of a pulse signal, based on an input from the input part 33, and the pulse generator 31 outputs a pulse signal to the gate of the IGBT 96 in accordance with the waveform.

The heat treatment apparatus 1 according to this preferred embodiment further includes a temperature calculating part 24 in the form of a computer system different from that of the controller 3. FIG. 8 is a block diagram of a peripheral structure including the temperature calculating part 24. The photodiode 21 included in the aforementioned light receiving part 20 generates a photoelectric current in accordance with the intensity of received light because of a photovoltaic effect. The photodiode 21 has the characteristic of being extremely short in response time. A current-to-voltage converter circuit 22 is a circuit for converting a weak current generated by the photodiode 21 into an easy-to-handle voltage signal. The current-to-voltage converter circuit 22 may be constructed using an operational amplifier, for example.

An amplifier circuit 23 amplifies the voltage signal outputted from the current-to-voltage converter circuit 22 to output the amplified voltage signal to a high-speed A-D converter 25 in the temperature calculating part 24. The high-speed A-D converter 25 converts the voltage signal amplified by the amplifier circuit 23 into a digital signal. A CPU 26 in the temperature calculating part 24 executes a previously set processing program to sample the digital signal outputted from the high-speed A-D converter 25 at predetermined time intervals. Then, the CPU 26 sequentially stores the sampled data in a memory 27, and calculates the temperature of the semiconductor wafer W from the stored data. This process will be described later in further detail.

The temperature calculating part 24 may be constructed using a one-chip microcomputer. The one-chip microcomputer, which is a kind of microcomputer, is in general a processor having a CPU, a memory, a timer and the like mounted on a single IC chip. When the temperature calculating part 24 according to this preferred embodiment is constructed using a one-chip microcomputer, the high-speed A-D converter 25 in addition to the CPU 26 and the memory 27 is incorporated in the IC chip. The one-chip microcomputer is not capable of performing general-purpose processes, but is capable of performing a specific process at high speeds. For this reason, the temperature calculating part 24 constructed using a one-chip microcomputer is capable of sampling an output signal from the photodiode 21 at sampling time intervals pronouncedly shorter than those of the controller 3 which is capable of performing general-purpose processes.

The temperature calculating part 24 is connected to the controller 3 via telecommunication lines, and is connected also to a display part 28. The display part 28 is constructed, for example, using a liquid crystal display, and displays results calculated by the temperature calculating part 24. The telecommunication lines connecting the temperature calculating part 24 and the controller 3 may be those for serial communication or for parallel communication.

The heat treatment apparatus 1 further includes, in addition to the aforementioned components, various cooling structures to prevent an excessive temperature rise in the chamber 6 and the lamp house 5 because of the heat energy generated from the flash lamps FL and the hot plate 71 during the heat treatment of a semiconductor wafer W. As an example, a water cooling tube (not shown) is provided in the chamber side portion 63 and the chamber bottom portion 62 of the chamber 6. The lamp house 5 has an air cooling structure in which a gas supply pipe 55 and an exhaust pipe 56 are provided to form a gas flow therein, thereby exhausting heat (with reference to FIGS. 1 and 5). Air is also supplied to a gap between the chamber window 61 and the lamp light radiation window 53 to cool down the lamp house 5 and the chamber window 61.

Next, the operation of the heat treatment apparatus 1 having the aforementioned configuration will be described. Description will be given herein first briefly on a general procedure for the process of heating a semiconductor wafer W by irradiation with flashes of light, and then on the process of calculating the temperature of the semiconductor wafer W. A semiconductor wafer W to be treated or processed herein is a semiconductor substrate doped with impurities (ions) by an ion implantation process. The impurities are activated by the heat treatment apparatus 1 performing the process of heating (annealing) the semiconductor wafer W by irradiation with flashes of light. The procedure in the heat treatment apparatus 1 which will be described below proceeds under the control of the controller 3 over the operating mechanisms of the heat treatment apparatus 1.

First, the holder 7 is moved downwardly from the treatment position shown in FIG. 5 to the transfer position shown in FIG. 1. The term "treatment position" as used herein refers to the position of the holder 7 where light is emitted from the flash lamps FL onto a semiconductor wafer W, i.e., the position of the holder 7 shown in FIG. 5 within the chamber 6. The term "transfer position" as used herein refers to the position of the holder 7 where a semiconductor wafer W is transported into and out of the chamber 6, i.e., the position of the holder 7 shown in FIG. 1 within the chamber 6. A reference position of the holder 7 in the heat treatment apparatus 1 is the treatment position. Prior to treatment, the holder 7 is in the treatment position. Upon the start of treatment, the holder 7 is moved downwardly to the transfer position. When moved down to the transfer position as illustrated in FIG. 1, the holder 7 comes in close proximity to the chamber bottom portion 62, so that the upper ends of the support pins 70 protrude through the holder 7 upwardly out of the holder 7.

Next, when the holder 7 is moved down to the transfer position, the valve 82 and the valve 87 are opened to introduce nitrogen gas at room temperature into the heat treatment space 65 of the chamber 6. Subsequently, the gate valve 185 is opened to open the transport opening 66. A transport robot outside the heat treatment apparatus 1 transports a semiconductor wafer W through the transport opening 66 into the chamber 6, and places the semiconductor wafer W onto the plurality of support pins 70.

The nitrogen gas introduced into the chamber 6 during the transport of the semiconductor wafer W into the chamber 6 is purged from the chamber 6 at a rate of about 40 L/min. The introduced nitrogen gas flows from the gas inlet buffer 83 in the direction of the arrows AR4 in FIG. 2 within the chamber 6, and is exhausted through the outlet passage 86 and the valve 87 shown in FIG. 1 by a utility exhaust system. Part of the nitrogen gas introduced into the chamber 6 is also exhausted from an exhaust port (not shown) provided inside the bellows 47. In the steps to be described below, the nitrogen gas is continuously introduced into and exhausted from the chamber 6, and the amount of nitrogen gas introduced into the chamber 6 is changed to various amounts in accordance with the steps of treating the semiconductor wafer W.

After the semiconductor wafer W is transported into the chamber 6, the gate valve 185 closes the transport opening 66. Then, the holder elevating mechanism 4 moves the holder 7 upwardly from the transfer position to the treatment position, which is in close proximity to the chamber window 61. In the course of the upward movement of the holder 7 from the transfer position, the semiconductor wafer W is transferred from the support pins 70 to the susceptor 72 of the holder 7, and then placed and held on the upper surface of the susceptor 72. When the holder 7 is moved up to the treatment position, the semiconductor wafer W held on the susceptor 72 is also held at the treatment position.

Each of the six zones 711 to 716 of the hot plate 71 has been already heated up to a predetermined temperature by the heater (the resistance heating wires 76) individually incorporated within each of the zones 711 to 716 (between the upper plate 73 and the lower plate 74). The holder 7 is moved upwardly to the treatment position, so that the semiconductor wafer W comes in contact with the holder 7. This allows the heaters incorporated in the hot plate 71 to preheat the semiconductor wafer W, thereby raising the temperature of the semiconductor wafer W gradually.

Figure 9:
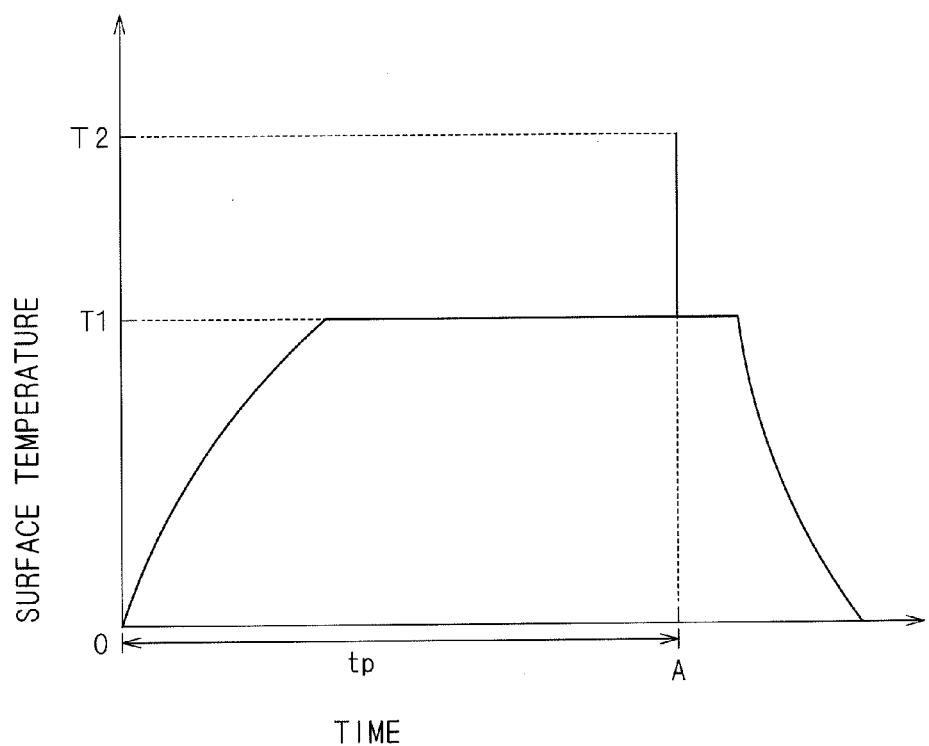
FIG. 9 is a graph showing changes in surface temperature of a semiconductor wafer after the start of preheating.

FIG. 9 is a graph showing changes in the surface temperature of a semiconductor wafer W after the start of preheating. Preheating the semiconductor wafer W at the treatment position for a time period tp causes the temperature of the semiconductor wafer W to rise up to a preset preheating temperature T1. The preheating temperature T1 shall be on the order of 200 to 800° C., preferably on the order of 350 to 600° C., (in the present preferred embodiment, 500° C.) at which there is no apprehension that the impurities implanted in the semiconductor wafer W are diffused by heat. The time period tp for preheating the semiconductor wafer W shall be on the order of 3 to 200 seconds (in the present preferred embodiment, 60 seconds). A distance between the holder 7 and the chamber window 61 is freely adjustable by controlling the amount of rotation of the motor 40 of the holder elevating mechanism 4.

After a lapse of the preheating time period tp, the flash lamps FL start heating the semiconductor wafer W by irradiating the semiconductor wafer W with flashes of light at time A, with the holder 7 remaining at the treatment position. For the irradiation with light from the flash lamps FL, the capacitor 93 is charged in advance by the power supply unit 95. Then, with the capacitor 93 in the charged state, the pulse generator 31 in the controller 3 outputs a pulse signal to the IGBT 96.

FIG. 10 illustrates an example of the waveform of the pulse signal. The waveform of the pulse signal is specified by inputting from the input part 33 a recipe that is a sequence of defined parameters including a time interval (ON time) equivalent to the pulse width and a time interval (OFF time) between pulses. After an operator inputs the recipe containing descriptions of such parameters from the input part 33 to the controller 3, the pulse setting part 32 in the controller 3 sets a pulse waveform having repeated ON and OFF time intervals as shown in FIG. 10 in accordance with the recipe. Then, the pulse generator 31 outputs a pulse signal in accordance with the pulse waveform set by the pulse setting part 32. As a result, the pulse signal having the waveform as shown in FIG. 10 is applied to the gate of the IGBT 96, so that the turning ON and OFF of the IGBT 96 are controlled.

In synchronism with the turning ON of the pulse signal outputted from the pulse generator 31, the controller 3 controls the trigger circuit 97 to apply a high voltage to the trigger electrode 91. Thus, when the pulse signal inputted to the gate of the IGBT 96 is ON, a current inevitably flows across the electrodes of the glass tube 92, and the resultant excitation of xenon atoms or molecules induces light emission. The controller 3 outputs a pulse signal having the waveform shown in FIG. 10 to the gate of the IGBT 96, and also applies a trigger voltage to the trigger electrode 91 in synchronization with the turning ON of the pulse signal, thereby producing a flow of current having a sawtooth waveform in the circuit including the flash lamp FL. In other words, the value of the current flowing through the glass tube 92 of the flash lamp FL increases when the pulse signal inputted to the gate of the IGBT 96 is ON, and the current value decreases when the pulse signal is OFF. It should be noted that an individual current waveform corresponding to each pulse is defined by the constant of the coil 94.

The flow of a current in the circuit including the flash lamp FL causes the flash lamp FL to emit light. The emission intensity of the flash lamp FL is roughly proportional to the current flowing through the flash lamp FL. As a result, the waveform (profile) of the emission intensity of the flash lamp FL versus time has a pattern as shown in FIG. 11. The semiconductor wafer W held by the holder 7 lying at the treatment position is irradiated with light in accordance with the intensity waveform of the flash lamp FL as shown in FIG. 11.

If a flash lamp FL emits light without using a switching element such as the IGBT 96, the electrical charges stored in the capacitor 93 are consumed momentarily by emitting light only once, so that the waveform of the emission intensity of the flash lamp FL exhibits a single pulse having a width on the order of 0.1 to 10 milliseconds between a rapid rising edge and a rapid falling edge.

On the other hand, when the IGBT 96 is connected in the circuit and a pulse signal as shown in FIG. 10 is outputted to the gate of the IGBT 96 as in the present preferred embodiment, this circuit is turned ON and OFF intermittently by the IGBT 96, so that the current flowing from the capacitor 93 to the flash lamp FL is chopper-controlled. As a result, the light emission from the flash lamp FL is accordingly chopper-controlled, which allows the electrical charges stored in the capacitor 93 to be discharged intermittently and consumed in a divided manner at the flash lamp FL. This enables the flash lamp FL to repeatedly flash ON and OFF in an extremely short time. It should be noted that, before the value of current flowing through the flash lamp FL reaches exactly zero, the next pulse is applied to the gate of the IGBT 96 to increase the current value again. For this reason, the emission intensity never reaches exactly zero even while the flash lamp FL repeatedly flashes ON and OFF. The emission intensity of the flash lamp FL exhibits a pattern as shown in FIG. 11 from a macroscopic viewpoint while finely increasing and decreasing in a repeated manner.

The profile of the emission intensity of the flash lamp FL versus time is not limited to that having the pattern shown in FIG. 11, but may be appropriately changed by adjusting the waveform of the pulse signal applied to the gate of the IGBT 96. The profile of the emission intensity versus time may be determined in accordance with the purpose of the flash heating process (e.g., the activation of implanted impurities, and the process of recovering crystal defects created during impurity implantation). It should be noted that the total light emission time of the flash lamp FL for a single heating process is not greater than one second if the profile of the emission intensity of the flash lamp FL versus time has any configuration. The waveform of the pulse signal is adjustable by the time interval equivalent to the pulse width and the time interval between pulses, which are inputted from the input part 33.

The irradiation of a semiconductor wafer W with flashes of light from the flash lamps FL in accordance with the intensity waveform as shown in FIG. 11 causes the surface temperature of the semiconductor wafer W to increase slowly from the preheating temperature T1 to an intended treatment temperature T2, and then to decrease slowly. However, the surface temperature of the semiconductor wafer W can be said to increase slowly and then to decrease slowly, as compared with that obtained by conventional flash lamp annealing, and the light emission time of the flash lamps FL is not greater then one second. Thus, the increase and decrease in surface temperature according to this preferred embodiment occur in a significantly short time, as compared with those caused by the heating by irradiation with light using halogen lamps and the like.

After the semiconductor wafer W in the treatment position waits for about 10 seconds following the completion of the heating by irradiation with flashes of light using the flash lamps FL, the holder elevating mechanism 4 moves the holder 7 downwardly to the transfer position shown in FIG. 1 again, and the semiconductor wafer W is transferred from the holder 7 to the support pins 70. Subsequently, the transport opening 66, which has been closed by the gate valve 185, is opened, and the transport robot outside the heat treatment apparatus 1 transports the semiconductor wafer W placed on the support pins 70 out of the chamber 6. This completes the heat treatment of the semiconductor wafer W by irradiation with flashes of light in the heat treatment apparatus 1.

As described previously, the nitrogen gas is continuously fed into the chamber 6 during the heat treatment of the semiconductor wafer W in the heat treatment apparatus 1. The amount of nitrogen gas fed into the chamber 6 shall be about 30 liters per minute when the holder 7 is in the treatment position, and be about 40 liters per minute when the holder 7 is in other than the treatment position.

Figure 12:
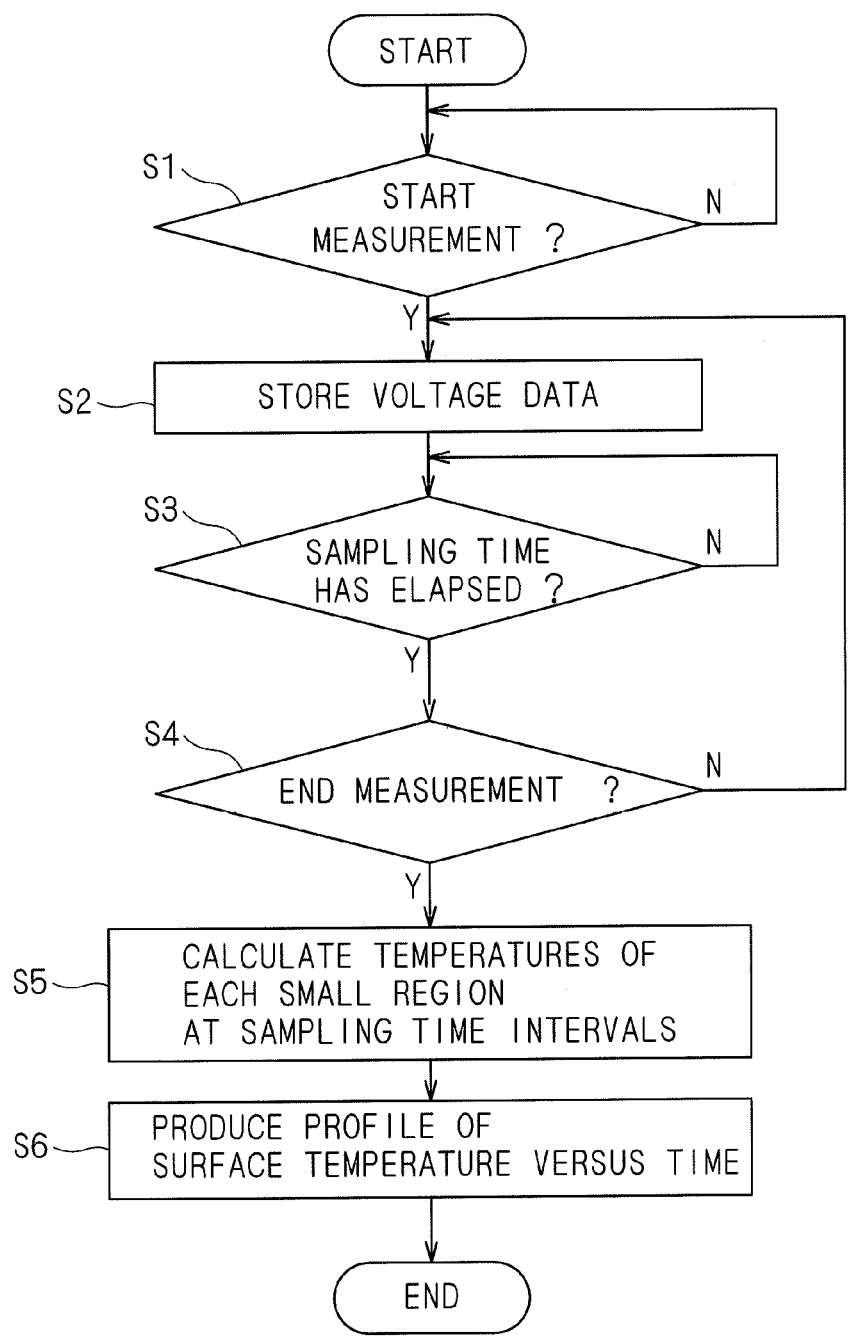
FIG. 12 is a flow diagram showing a procedure for calculating changes in temperature of the semiconductor wafer caused by irradiation with flashes of light.

Next, the process of calculating the temperature of a semiconductor wafer W in the heating process by irradiation with flashes of light as mentioned above will be described. FIG. 12 is a flow diagram showing a procedure for calculating changes in temperature of a semiconductor wafer W caused by irradiation with flashes of light. The CPU 26 in the temperature calculating part 24 executes a predetermined processing program, whereby the procedure shown in FIG. 12 proceeds.

First, when the flash lamps FL emit flashes of light in a manner as described above, part of the flashes of light are repeatedly reflected between the lamp house 5 and the chamber 6, and then enter the photodiode 21 in the light receiving part 20. In other words, the photodiode 21 receives a leak of the flashes of light emitted from the flash lamps FL and directed from the lamp house 5 toward the interior of the chamber 6. It should be noted that the light emission from the flash lamps FL is chopper-controlled by the IGBT 96. Thus, the emission intensity of the flash lamps FL has a pattern as shown in FIG. 11, and the leak of light has a similar waveform.

The photodiode 21 generates a photoelectric current in accordance with the intensity of the incoming flashes of light. Because of its extremely short response time, the photodiode 21 is capable of following flashes of light which dramatically change in intensity in a short time. The current-to-voltage converter circuit 22 converts the current generated by the photodiode 21 into an easy-to-handle voltage signal. The amplifier circuit 23 amplifies the voltage signal outputted from the current-to-voltage converter circuit 22. Thereafter, the high-speed A-D converter 25 in the temperature calculating part 24 converts the amplified voltage signal into a digital signal which is suitable for a computer to handle.

When the input voltage to the temperature calculating part 24 is not less than a predetermined threshold value, the measurement of voltage data starts (in Step S1). The photodiode 21 generates an extremely weak current when the flash lamps FL do not emit light. The threshold determination process in Step S1 is performed to prevent the acquisition of a voltage signal resulting from such an extremely weak current as the data. Specifically, when the rapid increase in the intensity of light entering the photodiode 21 after the start of light emission from the flash lamps FL causes the input voltage to the temperature calculating part 24 to reach the predetermined threshold value or higher, the procedure proceeds to Step S2, in which the storage of the voltage data starts. In this preferred embodiment, the photodiode 21 does not directly receive flashes of light emitted from the flash lamps FL, but receives a leak of the flashes of light. The use of even a leak of the flashes of light allows the temperature calculating part 24 to receive a sufficiently high input voltage, as compared with that obtained during no light emission, because the intensity of the flashes of light is very high. The determination in Step S1 may be made so that the measurement starts, for example, in synchronism with the output of the pulse signal from the pulse generator 31 in the controller 3 or in synchronism with the application of the voltage from the trigger circuit 97 to the trigger electrode 91.

In Step S2, the CPU 26 in the temperature calculating part 24 stores the level of the digital signal outputted from the high-speed A-D converter 25 as the voltage data into the memory 27. After a single piece of data is sampled in this manner, the procedure proceeds to Step S3, in which the CPU 26 waits until a previously set given sampling time interval has elapsed. The sampling time interval in Step S3 refers to a time interval at which the data is sampled. The sampling time interval may be set to any time length within a range acceptable by the temperature calculating part 24 in the form of hardware, and is preferably shorter because the temperature calculation accuracy to be described later becomes accordingly higher. In this preferred embodiment, the sampling time interval is set at 50 microseconds.

Next, the procedure proceeds to Step S4, in which the CPU 26 determines whether to end the measurement of the voltage data or not. This determination may be made by determining whether previously set data acquisition time has elapsed since the instant of the start of the measurement or not. The data acquisition time may be set to any time length in accordance with the waveform of the pulse signal inputted from the input part 33. Alternatively, in place of the determination based on the time, the CPU 26 may be adapted to end the measurement when the input voltage to the temperature calculating part 24 falls below a predetermined threshold value. However, some waveforms of the pulse signal inputted from the input part 33 have a pattern such that the intensity of flashes of light temporarily approaches zero and then increases again. For this reason, the use of the determination as to whether the previously set data acquisition time has elapsed or not allows the sampling with higher reliability.

When the measurement of the voltage data is not ended, the procedure returns to Step S2 again, and the level of the digital signal at that point in time is stored in the memory 27. In this manner, the process in Steps S2 and S3, i.e. the data sampling at the given sampling time intervals, is repeated until it is determined that the measurement is to be ended. The CPU 26 in the temperature calculating part 24 repeats the sampling of the level of the digital signal outputted from the high-speed A-D converter 25 at the given sampling time intervals for a predetermined period of time, and sequentially stores the sampled pieces of data together with respective times of sampling (respective times at which the pieces of data are sampled) into the memory 27.

In this manner, the intensity of flashes of light (the voltage data corresponding to the intensity of flashes of light, to be exact) is measured and acquired from the output from the photodiode 21. The pieces of voltage data repeatedly sampled at the given sampling time intervals and sequentially stored in the memory 27 exhibit a waveform similar to the waveform of the intensity of flashes of light versus time. In other words, plots of the pieces of voltage data stored in the memory 27 in chronological order along the times of sampling draw a waveform similar to the waveform (profile) of the intensity of flashes of light versus time shown in FIG. 11.

On the other hand, when the measurement of the intensity of flashes of light is ended, the CPU 26 in the temperature calculating part 24 subsequently performs a temperature calculating process in Step S5. For the calculation of the temperature of a semiconductor wafer W based on the voltage data provided from the output from the photodiode 21 in this preferred embodiment, the semiconductor wafer W is divided into a plurality of small regions (elements) arranged along the thickness thereof (in the direction of the normal thereto), and the temperatures of each of the small regions at predetermined time intervals are computed (which is known as finite element analysis).

Figure 13:
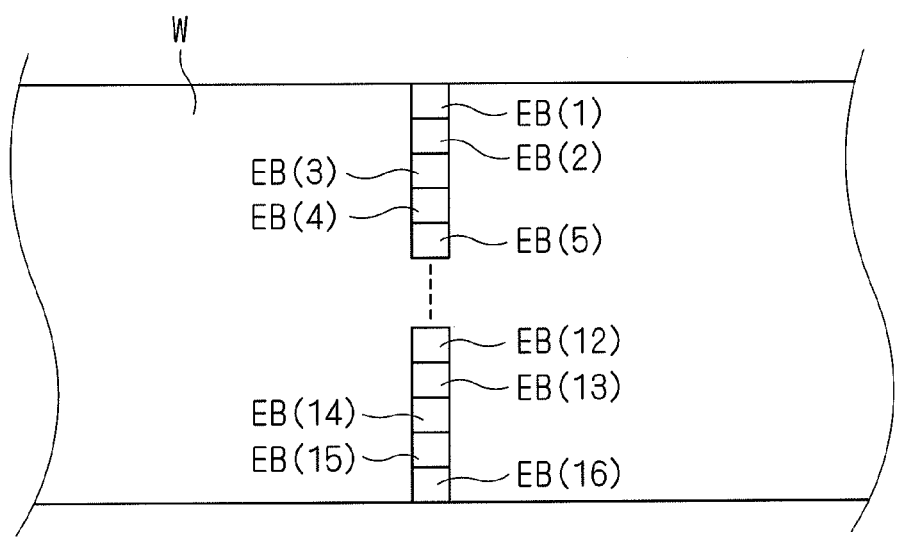
FIG. 13 illustrates a technique for dividing the semiconductor wafer into a plurality of small regions to calculate the temperatures of each of the small regions.

FIG. 13 illustrates a technique for dividing a semiconductor wafer W into a plurality of small regions to calculate the temperatures of each of the small regions. In this preferred embodiment, a given area of the semiconductor wafer W is divided into 16 small regions EB(1) to EB(16) arranged along the thickness thereof. It is assumed that the small regions EB(1), EB(2), EB(3), . . . , EB(14), EB(15), and EB(16) are arranged in the order named from the front surface (the surface to be irradiated with flashes of light) toward the back surface of the semiconductor wafer W. Each of the small regions EB has a thickness of approximately 50 μm because the semiconductor wafer W of silicon has a thickness of approximately 0.8 mm. The small regions EB(1) to EB(16) are generically referred to as small regions EB, unless otherwise identified. The number of small regions EB is, of course, not limited to 16, but a semiconductor wafer W is required only to be divided into at least two small regions EB.

Prior to the emission of flashes of light from the flash lamps FL, the semiconductor wafer W is heated to the preheating temperature T1 by the hot plate 71. In the stage of preheating, the entire semiconductor wafer W is uniformly heated. Thus, all of the temperatures of the 16 small regions EB(1) to EB(16) immediately before the emission of flashes of light are equal to the preheating temperature T1, which is used as an initial value.

Next, the temperature calculating part 24 calculates the temperatures of the 16 respective small regions EB(1) to EB(16) at each of the times of sampling, based on the voltage data sampled in Steps S1 to S4. In this preferred embodiment, a difference approximation of a one-dimensional heat conduction equation is used to sequentially calculate the temperatures of each of the 16 small regions EB(1) to EB(16) at the respective times of sampling. Specifically, based on the temperature of a small region EB (corresponding to each of the 16 small regions EB(1) to EB(16)) and heat flowing into and out of the small region EB at a given time of sampling (a first time) $t_m$, the temperature calculating part 24 calculates the temperature of the small region EB at the next time of sampling (a second time) $t_{m+1}$. The second time of sampling $t_{m+1}$ is later than the first time of sampling $t_m$ by an amount equal to the sampling time interval (in this preferred embodiment, 50 microseconds).

Heat flowing into and out of a small region EB is as follows. From the viewpoint of the small region EB(1) which is the outermost small region on the front surface side, heat generated by irradiation with flashes of light flows into the small region EB(1), and heat flows out of the small region EB(1) toward the small region EB(2) adjacent to and under the small region EB(1). From the viewpoint of the small region EB(16) which is the outermost small region on the back surface side, on the other hand, heat flows from the small region EB(15) adjacent to and over the small region EB(16) into the small region EB(16). From the viewpoint of each remaining small region EB(n) (where n is an integer in the range of 2 to 15), heat flows from the small region EB(n−1) adjacent to and over the small region EB(n) into the small region EB(n), and heat flows from the small region EB(n) toward the small region EB(n+1) adjacent to and under the small region EB(n).

The amount of heat generated at the front surface of a semiconductor wafer W by irradiation with flashes of light, i.e. the amount of heat flowing into the small region EB(1), is determined from the voltage data acquired in Steps S1 to S4. The amount of heat transferred between adjacent ones of the small regions EB is determined from a temperature gradient present between the adjacent small regions EB. For this calculation are required the density, specific heat, and thermal conductivity of the semiconductor wafer W. The density and specific heat of the semiconductor wafer W used herein are known constants.

The thermal conductivity has a temperature dependence as shown in FIG. 14. The higher the temperature of a semiconductor wafer W is, the lower the thermal conductivity of the semiconductor wafer W is. Thus, the present preferred embodiment uses the thermal conductivity in accordance with the temperature of the semiconductor wafer W. Specifically, a correlation as shown in FIG. 14 in the form of a table is held in the memory 27. The thermal conductivity at the temperature of each small region EB at the first time of sampling $t_m$ is determined from the table. Using the determined thermal conductivity, the amount of heat flowing into and out of the small regions adjacent to each small region EB is calculated, and the temperature of each small region EB at the second time of sampling $t_{m+1}$ is calculated.

In the aforementioned computation process, there are no apparent heat flows along the surface of the semiconductor wafer W because of the uniform temperature of the semiconductor wafer W along the surface thereof. It is hence unnecessary to take the transfer of heat along the surface of the semiconductor wafer W into consideration. Also, the initial value of the temperatures of the 16 small regions EB(1) to EB(16) is the preheating temperature T1, as mentioned earlier.

As described above, the temperatures of the 16 small regions EB(1) to EB(16) are calculated at the times of sampling. The CPU 26 in the temperature calculating part 24 stores the calculated temperatures in the memory 27. Then, the CPU 26 in the temperature calculating part 24 extracts only the pieces of data about the small region EB(1), which is the outermost small region on the front surface side, from the temperature data stored in the memory 27 to make plots of the extracted pieces of data in chronological order along the times of sampling, thereby producing a profile of the surface temperature of the semiconductor wafer W versus time (in Step S6). FIG. 15 is a graph showing an example of the profile of the surface temperature of the semiconductor wafer W versus time thus produced. The temperature calculating part 24 causes the produced profile of the surface temperature versus time as shown in FIG. 15 to appear on the display part 28.

In the present preferred embodiment, the photodiode 21 excellent in responsivity receives flashes of light emitted from the flash lamps FL in the process of heating by irradiation with flashes of light, and the waveform of the intensity of the flashes of light versus time is acquired using the voltage data obtained from the output from the photodiode 21. Then, a heat conduction simulation using the acquired data is performed to calculate the temperature of the semiconductor wafer W irradiated with the flashes of light from the flash lamps FL.

Even in the cases of the same total energy of emitted flashes of light and different waveforms of the intensity of flashes of light versus time, the present preferred embodiment is capable of calculating the temperature of the semiconductor wafer W in accordance with the waveforms of the intensity of flashes of light versus time because the temperature of the semiconductor wafer W is computed using the data corresponding to the intensity of flashes of light obtained from the output from the photodiode 21. The preferred embodiment is thus capable of determining the surface temperature of the semiconductor wafer W irradiated with flashes of light, irrespective of the waveform of the emission intensity of the flash lamps FL.

In computing the temperature of the semiconductor wafer W, the present preferred embodiment divides the semiconductor wafer W into the plurality of small regions EB arranged along the thickness of the semiconductor wafer W to calculate the temperatures of each of the small regions EB at the sampling time intervals. In other words, the preferred embodiment uses the finite element method for the discretization of the semiconductor wafer W along the thickness of the semiconductor wafer W, and uses the difference method to perform the computation process along the time axis. The temperature dependence of the thermal conductivity is taken into consideration in this computation process. This computation process is therefore capable of precisely calculating the temperature of the semiconductor wafer W irradiated with flashes of light.

Additionally, the light receiving part 20 including the photodiode 21 according to the present preferred embodiment is positioned so as to receive a leak of flashes of light directed from the lamp house 5 toward the interior of the chamber 6. This prevents the flashes of light emitted from the flash lamps FL from directly impinging upon the photodiode 21 to protect a measuring circuit including the photodiode 21 and the temperature calculating part 24.

While the preferred embodiment according to the present invention has been described hereinabove, various modifications of the present invention in addition to those described above may be made without departing from the scope and spirit of the invention. For example, although the light receiving part 20 is disposed in the gap between the lamp house 5 and the chamber 6 in the aforementioned preferred embodiment, the position of the light receiving part 20 is not limited to this, but the light receiving part 20 is required only to be positioned so as to receive a leak of flashes of light. The light receiving part 20 may be disposed, for example, outside the lamp house 5 and the chamber 6 or be positioned so as not to receive flashes of light directly within the chamber 6. Alternatively, a quartz member (e.g., a quartz rod) may be positioned so as to receive a leak of flashes of light emitted from the flash lamps FL, so that the light entering the quartz member is guided through an optical fiber and the like to the photodiode 21.

Further, the preferred embodiment uses the finite element method for the discretization of the semiconductor wafer W along the thickness of the semiconductor wafer W, and uses the difference method to perform the temperature calculating process along the time axis. The computation process for temperature calculation, however, is not limited to this, but other techniques such as an integration method may be used.

Also, the IGBT 96 according to the present preferred embodiment is incorporated in the driving circuit for a flash lamp FL to chopper-control the current flowing through the flash lamp FL. The technique according to the present invention, however, may be applied to a driving circuit that does not include the IGBT 96. In other words, the photodiode 21 may receive flashes of light emitted from the flash lamps FL in which the passage of current is not chopper-controlled, so that the temperature of the semiconductor wafer W is calculated using the voltage data obtained from the output from the photodiode 21.

Although the IGBT 96 is used as a switching element in the present preferred embodiment, another transistor capable of turning ON and OFF the circuit in accordance with the signal level inputted to the gate thereof may be used in place of the IGBT 96. It is, however, preferable to use an IGBT or a GTO (gate turn-off) thyristor which are suitable for handling high power because the emission of light from the flash lamps FL consumes considerably high power.

Although the 30 flash lamps FL are provided in the lamp house 5 according to the above-mentioned preferred embodiment, the present invention is not limited to this. Any number of flash lamps FL (including only one flash lamp FL) may be provided. The flash lamps FL are not limited to the xenon flash lamps, but may be krypton flash lamps. Further, the light source serving as a heating source is not limited to the flash lamps, but other types of lamps may be used, in which case the technique according to the present invention is applicable to achieve the calculation of the temperature of the semiconductor wafer W.

The method of setting the waveform of the pulse signal to be outputted to the gate of the IGBT 96 is not limited to inputting the parameters including the pulse width, the time interval between pulses, and the like one by one from the input part 33. For example, the setting of the waveform is done by an operator inputting the waveform directly in graphical form from the input part 33, by reading the waveform previously set and stored in a storage part such as a magnetic disk and the like, or by downloading the waveform from outside the heat treatment apparatus 1.

In the aforementioned preferred embodiment, the temperature calculating part 24 samples the output from the photodiode 21, and also calculates the temperature of the semiconductor wafer W. However, the computation for the temperature calculation, which is a process performed ex post facto, may be performed by the controller 3. It should be noted that the sampling is preferably performed by the temperature calculating part 24 because high-speed processing is required for the sampling.

Also, in the aforementioned preferred embodiment, the semiconductor wafer W is preheated by placing the semiconductor wafer W on the hot plate 71. The technique for preheating is not limited to this, but a halogen lamp may be provided to emit light toward a semiconductor wafer W, thereby preheating the semiconductor wafer W up to the preheating temperature T1. It is, however, preferable that light shielding is provided to a light path from the halogen lamp to the light receiving part 20 to prevent the light emitted from the halogen lamp from becoming disturbance light during the irradiation with flashes of light.

Moreover, a substrate to be processed by the heat treatment technique according to the present invention is not limited to a semiconductor wafer, but may be a glass substrate for use in a liquid crystal display apparatus, and a substrate for a solar cell. Also, the technique according to the present invention may be applied to the joining of metal and silicon, and to the crystallization of polysilicon.

While the invention has been described in detail, the foregoing description is in all aspects illustrative and not restrictive. It is understood that numerous other modifications and variations can be devised without departing from the scope of the invention.

What is claimed is:

1. A heat treatment apparatus for heating a substrate by irradiating the substrate with flashes of light, comprising:
    a chamber for receiving a substrate;
    a holder for holding the substrate within said chamber;
    a flash lamp received in a lamp house and configured to irradiate the substrate held by said holder with flashes of light;
    a photodiode for receiving the flashes of light directed from said flash lamp before the flashes pass through the substrate; and
    a temperature calculating part for calculating the temperature of the substrate irradiated with the flashes of light directed from said flash lamp, based on an output from said photodiode.

2. The heat treatment apparatus according to claim 1, wherein
    said temperature calculating part calculates the temperatures of regions of the substrate at predetermined time intervals, said regions being defined by dividing the substrate thereinto along the thickness of the substrate.

3. The heat treatment apparatus according to claim 2, wherein
    based on the temperature of each of said regions and heat flowing into and out of each of said regions at a first time, said temperature calculating part calculates the temperature of each of said regions at a second time, said second time being later than said first time by an amount equal to each of said predetermined time intervals.

4. The heat treatment apparatus according to claim 3, wherein
    said temperature calculating part calculates the temperature of each of said regions at the second time, using a thermal conductivity at the temperature of each of said regions at the first time.

5. The heat treatment apparatus according to claim 4, wherein
    said holder includes a heater for preheating the substrate held by said holder, and said temperature calculating part performs a temperature calculating process, using a preheating temperature attained by said heater as an initial value.

6. The heat treatment apparatus according to claim 1, further comprising a switching element for chopper-controlling a current flowing through said flash lamp.

7. The heat treatment apparatus according to claim 1, wherein a gap is formed between the lamp house and the chamber, and
    said photodiode is positioned so as to receive a leak of flashes of light from the gap, as emitted from said flash lamp, and directed from said lamp house toward the interior of said chamber.

8. The heat treatment apparatus according to claim 1, wherein
    said photodiode has a measuring wavelength range corresponding to a visible light range.

9. A method of heating a substrate by irradiating the substrate with flashes of light, comprising the steps of:
    (a) directing flashes of light from a flash lamp onto a substrate; and
    (b) receiving the flashes of light directed from the flash lamp, using a photodiode before the flashes pass through the substrate, to calculate the temperature of the substrate irradiated with the flashes of light directed from said flash lamp, based on an output from said photodiode.

10. The method according to claim 9, wherein
    the temperatures of regions of the substrate at predetermined time intervals are calculated in said step (b), said regions being defined by dividing the substrate thereinto along the thickness of the substrate.

11. The method according to claim 10, wherein
    based on the temperature of each of said regions and heat flowing into and out of each of said regions at a first time, the temperature of each of said regions at a second time is calculated in said step (b), said second time being later than said first time by an amount equal to each of said predetermined time intervals.

12. The method according to claim 11, wherein the temperature of each of said regions at the second time is calculated in said step (b), using a thermal conductivity at the temperature of each of said regions at the first time.

* * * * *